(12) United States Patent
Prestigiacomo et al.

(10) Patent No.: US 11,711,983 B2
(45) Date of Patent: Jul. 25, 2023

(54) HIGH-TEMPERATURE SUPERCONDUCTING STRIATED TAPE COMBINATIONS

(71) Applicant: The Government of the United States of America, as represented by the Secretary of the Navy, Arlington, VA (US)

(72) Inventors: Joseph C. Prestigiacomo, Springfield, VA (US); Raymond C. Y. Auyeung, Alexandria, VA (US); Michael S. Osofsky, Clarksville, MD (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 0 days.

(21) Appl. No.: 17/975,465

(22) Filed: Oct. 27, 2022

(65) Prior Publication Data

US 2023/0081740 A1    Mar. 16, 2023

Related U.S. Application Data

(62) Division of application No. 16/218,471, filed on Dec. 12, 2018, now Pat. No. 11,600,762.

(Continued)

(51) Int. Cl.

| | |
|---|---|
| *H01L 39/24* | (2006.01) |
| *H10N 60/20* | (2023.01) |
| *H10N 60/01* | (2023.01) |
| *B23K 1/00* | (2006.01) |
| *B23K 3/06* | (2006.01) |
| *B23K 35/02* | (2006.01) |
| *H01L 21/67* | (2006.01) |

(Continued)

(52) U.S. Cl.
CPC ......... *H10N 60/203* (2023.02); *B23K 1/0016* (2013.01); *B23K 3/0623* (2013.01); *B23K 35/0222* (2013.01); *H01L 21/67092* (2013.01); *H01L 21/681* (2013.01); *H01L 21/6836* (2013.01); *H01L 21/6838* (2013.01); *H01L 24/03* (2013.01); *H10N 60/01* (2023.02); *H10N 60/0801* (2023.02); *B23K 35/264* (2013.01); *B23K 2101/42* (2018.08); *H01L 2221/68309* (2013.01); *H01L 2224/03003* (2013.01); *H01L 2224/0311* (2013.01); *H01L 2224/05109* (2013.01); *H01L 2224/05113* (2013.01); *H01L 2924/014* (2013.01); *H01L 2924/01322* (2013.01)

(58) Field of Classification Search
CPC .................. H10N 60/203; H10N 60/0801
See application file for complete search history.

*Primary Examiner* — Paul A Wartalowicz
(74) *Attorney, Agent, or Firm* — US Naval Research Laboratory; Stephen T. Hunnius

(57) ABSTRACT

This disclosure teaches methods for making high-temperature superconducting striated tape combinations and the product high-temperature superconducting striated tape combinations. This disclosure describes an efficient and scalable method for aligning and bonding two superimposed high-temperature superconducting (HTS) filamentary tapes to form a single integrated tape structure. This invention aligns a bottom and top HTS tape with a thin intervening insulator layer with microscopic precision, and electrically connects the two sets of tape filaments with each other. The insulating layer also reinforces adhesion of the top and bottom tapes, mitigating mechanical stress at the electrical connections. The ability of this method to precisely align separate tapes to form a single tape structure makes it compatible with a reel-to-reel production process.

13 Claims, 2 Drawing Sheets

Related U.S. Application Data

(60) Provisional application No. 62/598,541, filed on Dec. 14, 2017, provisional application No. 62/598,539, filed on Dec. 14, 2017, provisional application No. 62/728,650, filed on Sep. 7, 2018.

(51) Int. Cl.
  *H01L 21/68* (2006.01)
  *H01L 21/683* (2006.01)
  *H01L 23/00* (2006.01)
  *B23K 101/42* (2006.01)
  *B23K 35/26* (2006.01)

HIGH-TEMPERATURE SUPERCONDUCTING STRIATED TAPE COMBINATIONS

REFERENCE TO RELATED APPLICATION

This application is a non-provisional of, and claims priority to and the benefits of, U.S. patent application Ser. No. 16/218,471 filed on Dec. 12, 2018, U.S. Provisional Patent Application No. 62/598,541 filed on Dec. 14, 2017, U.S. Provisional Patent Application No. 62/598,539 filed on Dec. 14, 2017, and U.S. Provisional Patent Application No. 62/728,650 filed on Sep. 7, 2018, the entireties of each are hereby incorporated by reference.

BACKGROUND

This disclosure concerns high-temperature superconducting striated tape and methods of making high-temperature superconducting striated tape combinations.

The term 'tape' in this invention is generalized to mean structures that do or do not contain adhesive.

The zero DC resistance property of HTS enable them to carry large currents even in significant magnetic fields and thus enables the reduction of conductor weight and volume of various systems.

The second generation (2G) HTS coated conductors used in such DC applications consist of flat metal tapes coated by thin layers of oxide buffer layers and thin HTS coatings. Different types of cables and wires that use 2 G HTS are being developed for high current applications but the flat geometry causes significant losses in AC applications.

The lack of conductors and cables suitable for AC applications has created a bottleneck that complicates the development of inductors, transformers, and stators for motors and generators.

There has been no demonstration of a practical transposed multifilament twisted HTS coated conductor with low AC losses.

AC loss of YBCO coated conductors can be reduced by dividing the YBCO film into thin filament arrays. AC losses can be further reduced by the periodic introduction of filament bridges along the conductor length that allow for flux penetration in all the filaments. This approach requires that two striated HTS tapes be bonded with the filament sides facing each other separated by an insulating layer. The filaments from the two tapes must electrically connect each another only at the edges to prevent shorting.

TABLE I

|   | Electrical Bond | Mechanical Bond | Insulating Layer |
|---|---|---|---|
| Ref. 1 | Diffusion + Crimping | Electrical Bond | Mica thin film |
| Ref. 2 | Diffusion + Etched Mesa | Electrical Bond | Photoresist |
| Ref. 3 | Diffusion + Hot press | Electrical Bond | Kapton tape |
| Ref. 4 | Manual Soldering (pure indium) | Electrical Bond | Fiber-glass epoxy tape |

A summary of previous work in connecting two composite electrical tapes face-to-face is given in Table I.

There are several technical challenges associated with these prior art methods.

First, in all cases the integrity of the bond relies on the mechanical strength of the electrical connection for adhesion.

Second, the time required for diffusion bonding prevents practical scale-up of the fabrication.

Third, the insulating layer creates a gap between the tapes that complicates the electrical bonding process.

Fourth, the insulating layers previously used do not provide adequate isolation of adjacent filaments during solder bonding.

Fifth, the filament widths in HTS tapes are < few hundred microns and openings in the insulating layer must be aligned precisely between the upper and lower filaments.

This invention disclosure describes a process that enables the precise alignment and placement of the HTS striated tape and insulating layers by incorporating indexing holes in each constituent tape.

This invention disclosure enables reliable adhesion of the top and bottom tapes while providing containment of solder to the bond area without relying on just electrical bonds for adhesion strength.

SUMMARY OF DISCLOSURE

Description

This disclosure teaches methods for making high-temperature superconducting striated tape and the product high-temperature superconducting striated tape.

This disclosure describes an efficient and scalable method for aligning and bonding two superimposed high-temperature superconducting (HTS) filamentary tapes to form a single integrated tape structure.

This invention aligns a bottom and top HTS tape with a thin intervening insulator layer with microscopic precision, and electrically connects the two sets of tape filaments with each other.

The insulating layer also reinforces adhesion of the top and bottom tapes, mitigating mechanical stress at the electrical connections.

The ability of this method to precisely align separate tapes to form a single tape structure makes it compatible with a reel-to-reel production process.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

This disclosure teaches electrically and mechanically connected high-temperature superconducting striated tape combinations and methods of making electrically and mechanically connected high-temperature superconducting striated tape combinations.

This disclosure describes an efficient and scalable method for aligning and bonding two superimposed high-temperature superconducting (HTS) filamentary tapes to form a single integrated tape structure.

This invention aligns a bottom and top HTS tape with a thin intervening insulator layer with microscopic precision, and electrically connects the two sets of tape filaments with each other.

The insulating layer also reinforces adhesion of the top and bottom tapes, mitigating mechanical stress at the electrical connections.

The ability of this method to precisely align separate tapes to form a single tape structure makes it compatible with a reel-to-reel production process.

Example 1

Figure 1:
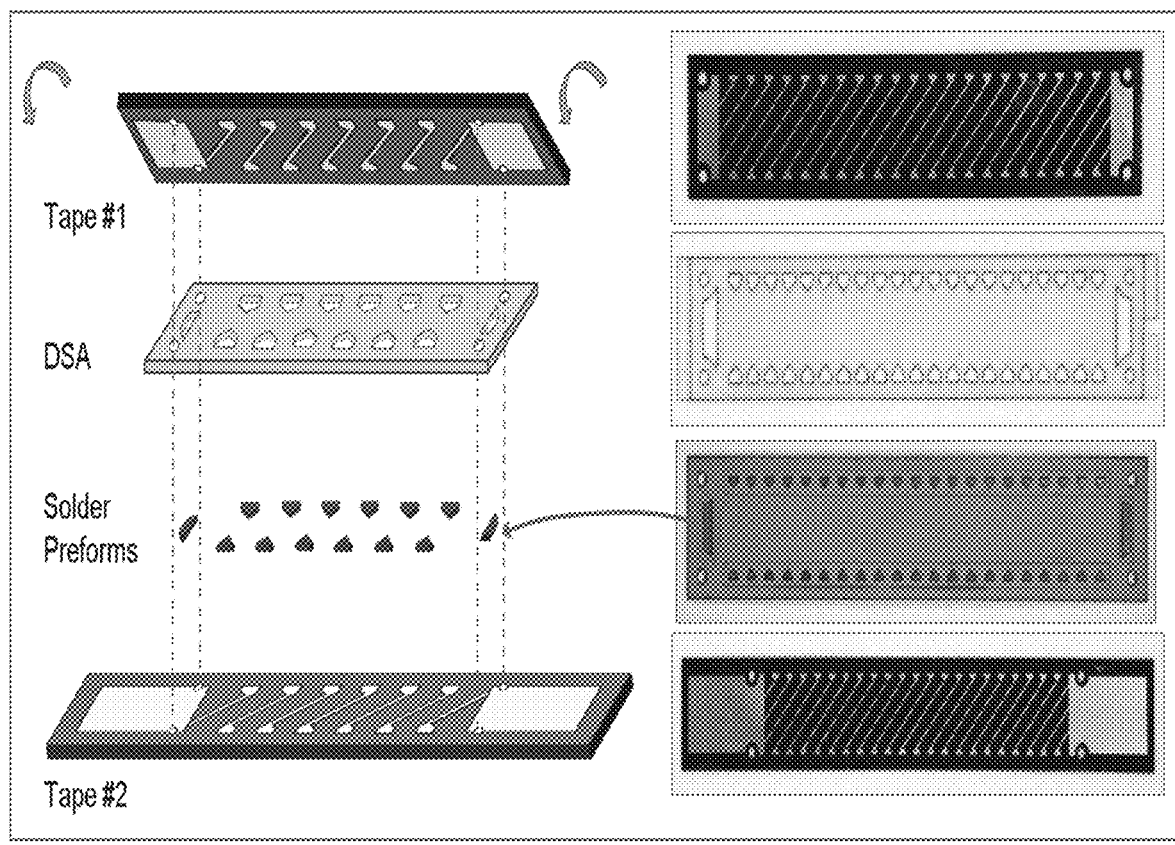
FIG. 1 is an illustration of final components in assembled tape and actual components used to fabricate the striated tape structure for low AC loss. Double sided adhesive (DSA) shown with backing layers present and solder preforms shown attached to release tape for the decal imprinting and bonding of solder (DIBS) procedure, invented by the same inventors and detailed in another patent application. Drawing is not to scale.

The basic components of a bonded striated tape are shown in FIG. 1.

It consists of two striated HTS tapes, an insulator (and adhesive) layer and solder preforms.

An alignment jig (not shown) with index pins is used to align all components together. An alignment jig is a device or structure that helps align and assemble all the separate components together on a 2-D planar or 3-D curved surface with high precision. With judicious choice of indexing holes and pins in each component of the superconducting tape structure, all components can be aligned and bonded with less than 50 microns spatial tolerance. Other methods of indexing each component of the striated tape structure such as mechanical means (e.g. notches, holes, guides) or optical means (e.g. laser, LED, lamp) are possible. As long as there is a 'complementary' structure on the alignment jig to match the indexed component, then high spatial accuracy can be maintained.

The striated HTS tapes are made by laser lithography and patterning techniques and the indexing holes are made by laser micromachining.

With lithography, liquid photoresists can be applied to the tape using spray, spin or dip processes, or a solid film photoresist can be laminated to the tape.

Example 2

A solid film resist can be pre-patterned and pre-indexed before being applied to the tape and could simplify the setup and shorten processing time.

Depending on the chemistries of the process, either positive or negative resists could be used.

Note that different shapes and quantities of indexing holes may be used to ensure alignment over long lengths.

For example, rectangular index holes can be spaced regularly along both edges of the tape in a reel-to-reel system. The indexing holes can also be made in a separate carrier to which the HTS tape is securely attached. This arrangement would conserve the HTS material while still taking advantage of the indexing feature.

Example 3

The double-sided adhesive (DSA) is 1 mil thick (adhesive only) and initially protected by a liner on both sides.

The DSA is rated for operation over a wide temperature range (−185 to 260° C.).

Openings that coincide with the ends of the HTS filaments are laser-machined through the adhesive.

This adhesive (with one liner removed) is carefully aligned and placed over one of the HTS tapes using the alignment jig.

Example 4

Two striated high-temperature superconductor (HTS) tapes or foils made by standard laser lithography and patterning techniques and include laser machined indexing holes.

Solder preform release tape with indexing holes.

Double-sided silicone-based thin adhesive, (DSA), with protective liners on both sides with a wide operating temperature range and with laser machined indexing holes.

Alignment jig with indexing pins for aligning and bonding tape structures.

Laser micromachining system which includes: a) Laser—preferably pulsed UV (355 nm wavelength, 30-70 ns pulsewidth, >10 kHz repetition rate) with enough energy to both expose photoresist and laser-cut thin metal foils (<500 microns) and b) Laser micromachining system incorporating a) fast-scanning galvanometric (galvo) mirrors, laser pulse amplitude and timing control, high-precision and accuracy X-Y translation stage pair, vacuum chuck, parfocal optical inspection camera, and stage and mirror scanning software.

The DSA must be laser-cut with a pattern of 'through-hole' windows that matches the pattern of solder preforms. The sizes of these windows must allow the solder to flow and fill the window area to a uniform thickness without excess material escaping beyond the window edges. The sizes of the windows must be designed in conjunction with the solder and DSA thicknesses such that the reflowed/melted solder thickness will not exceed the DSA thickness. The laser energy and galvo scan parameters must be chosen to cut completely through the liners and adhesive without causing any melting which would make it difficult to remove the liners without damaging the adhesive. In addition, non-adhesive tabs must be fabricated to extend beyond the adhesive portion of the DSA to facilitate its handling and application onto a receiving surface. Of course, indexing holes must also be laser-cut into the DSA tape without damaging the adhesive.

The parts, structure and alignment of the final HTS assembly are the critical elements of this invention, the components of the striated tape structure can be assembled in different ways provided all the layers and their order are preserved as shown in FIG. 1.

Figure 2:
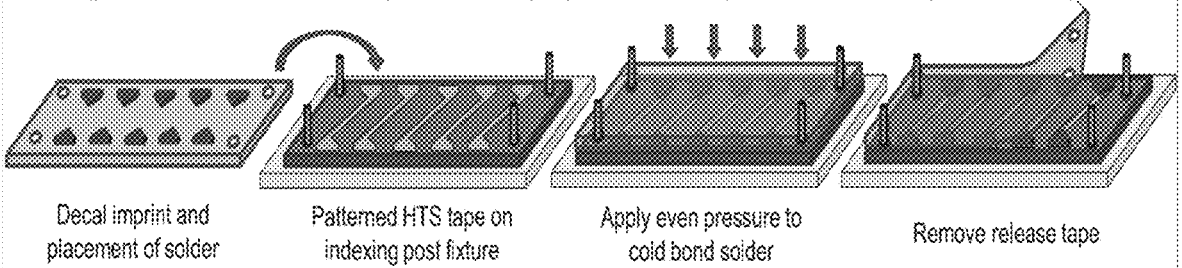
FIG. 2 illustrates a step-by-step diagram of the low AC-loss HTS cable fabrication process. Step #2 is performed on a separate fixture.
Figure 2:
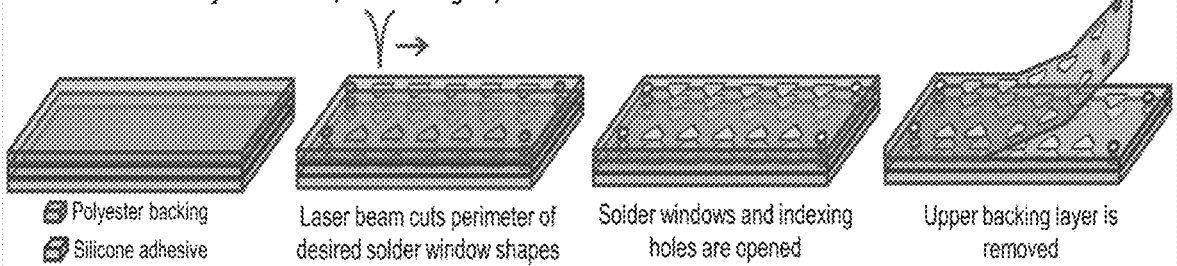
Figure 2:
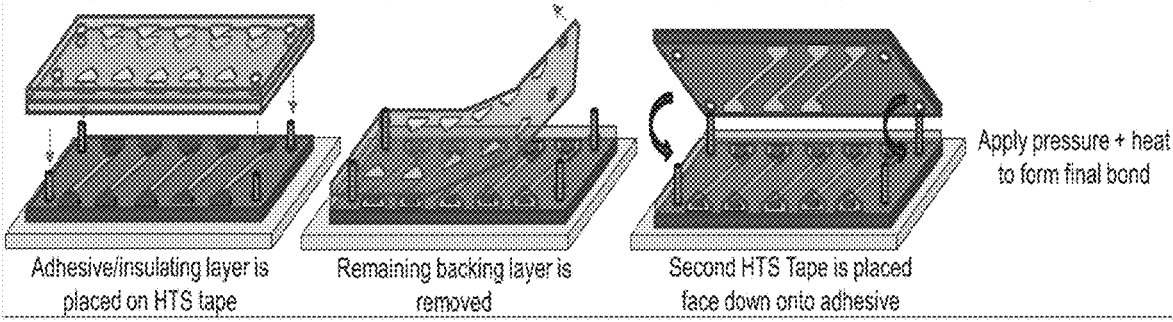

One option, as discussed below, is to bond the solder preforms onto one HTS tape first and then apply the DSA over this tape with the openings surrounding the preforms as shown in FIG. 2.

Example 5

Place HTS tape #2 with patterned side facing up onto the alignment jig using the indexing pins as a guide.

Align the solder release tape with indexing holes (with the preforms facing the HTS tape) over the indexing pins of the alignment jig and press onto HTS tape #2.

Separate the release tape from the solder preforms leaving them bonded to the HTS tape #2.

Remove one liner and align the laser-patterned DSA over the indexing pins of the alignment jig before placing onto HTS tape #2. The windows of the DSA will be aligned with the solder preforms.

Remove second liner from DSA tape.

Align indexing holes of HTS tape #1 (with patterned side facing tape #2) over the indexing pins of the alignment jig and place onto tape #2.

Apply pressure and/or heat to the entire assembly until solder has melted and bonded the entire HTS tape assembly.

The critical factor in creating a striated tape structure is the precision bonding of narrow individual filaments from the top and bottom tapes to form a continuous circuit. The indexing holes of all components of the superconducting tape assembly and the indexing pins of the alignment jig ensure precise spatial alignment between all components with very low errors.

As summarized in Table I, different methods have been used to electrically bond the filament edges from the two tapes. Three of these methods involve thermal annealing of the tapes to allow diffusion bonding across the interface of the two filament surfaces [1-3]. However, the long processing times (2-3 hours), high pressures (several MPa), and in some cases the pure $O_2$ atmosphere [1,3] required limit this prior art method's practicality. In addition, to make up for the gap between the tapes caused by the inclusion of an insulating layer, the edge bonds formed by diffusion bonding require either crimping at the edges [1], etching a recessed area of the filament's silver coating in order to fill the interior region with photoresist as insulation and create a raised mesa contact area at the edge [2], or sputtering additional silver.

A more practical solution is to use a low melting temperature solder for bonding the 2 G HTS coated conductors that prevents damaging or delaminating the layered structure. Several types of solder exist with different melting temperatures and resistivities at 77 K, ($T_m$, $\rho_{77K}$), such as $In_{52}Sn_{48}$ (118° C., 12.5μΩ-cm), Wood's metal (70° C., 19.3 μΩ-cm), $In_2Bi$ (72° C., 39 μΩ-cm), and $Bi_{57}In_{26}Sn_{17}$ (79° C., 41 μΩ-cm) [17]. $In_2Bi$ solder is recommended because of the low melting temperature and its commercial availability in a flat ribbon form. Measurements of single junction bonds of HTS filaments using $In_2Bi$ have shown that the contact resistance is similar to that achieved using diffusion bonding. In addition, the thermal expansion of the solder between room temperature and the operating temperature is a factor that must be considered. For $In_2Bi$, the thermal expansion between 300 K and 77 K is approximately −0.65% while YBCO coated conductor is approximately −0.25%. Despite this mismatch, no delamination effects upon cooldown have been observed.

A simple soldering method for selectively bonding multiple isolated areas on a surface exploits the different solder wetting properties of the filament surfaces and the insulator layers (as in solder masking) so that the solder would only bond to the filament areas. This technique is traditionally used with solder pastes; however, the high temperatures needed to activate the solder flux are incompatible with 2 G HTS tapes. Alternatively, either the edges of the entire tape structure can be dipped in a low melting temperature eutectic solder or a bead of solder applied to the tape edges. However, tests have shown that the solder occasionally adheres to the insulator layer and solder bonds were inconsistent at the filaments. Even doctor blading the solder into well-defined windows over the striated tape did not produce sufficiently uniform bonds. Preventing the solder from bleeding out of the bond area and bridging to adjacent edge contacts becomes critical once their spacing reaches the order of the insulating layer thickness, since current sharing among adjacent filaments will negatively affect the transposed conduction path.

Solder preforms deliver a consistent and precise amount of solder in various shapes and sizes and are used routinely in 'pick-and-place' machines in electronics assembly lines. A reel of solder preforms of a prescribed shape and size could be used in a 'pick-and-place' machine to bond to the striated tape. However, since all the solder preforms on a reel are the same size and the preforms are individually placed onto the HTS tape, this is a serial process which may limit throughput.

Example 6

By pre-placing solder preforms of any geometry at pre-determined locations on a release tape, then the entire pattern of solder preforms can be transferred and bonded to the striated tape in a parallel manner thereby increasing throughput.

The Decal Imprinting and Bonding of Solder (DIBS) process, described in a separate patent application, allows any combination of size, shape and location of solder preforms to be pre-assembled on a release tape and bonded collectively to a receiving surface.

Note that this solder release tape can be easily adapted to a reel-to-reel system by using regularly spaced indexed holes to match the guide pins in a rotating reel.

For bonding the filaments in a stacked striated tape structure, the solder preforms before reflow are slightly higher than the adhesive (e.g. $In_2Bi$ 2-mil thick eutectic solder ribbon) and are placed (using DIBS) onto a bare striated HTS tape or the HTS tape already covered with the adhesive.

The thickness of the adhesive and the solder preforms are minimized to reduce electrical resistive losses, but the two thicknesses must be designed together with the DSA window such that the final thickness of the reflowed solder does not exceed the thickness of the DSA nor the final solder dimensions exceed those of the DSA window. The ends of each filament can be widened to increase the solder bond area and hence lower its contact resistance.

The first and final few filaments terminate in large pads that allow the attachment of leads for electrical measurement across the transposed region. The current lead pads of striated HTS tape #1 are solder-bonded to the extended pads on tape #2 to allow leads access to the pads on the same side. This last feature reduces shearing forces between tapes when clamping the pads since only one side of the stacked tape structure is gripped.

The top striated HTS tape is next placed over the alignment jig with the filament side facing the adhesive using the indexing pins as guides.

The alignment jig is then placed in a press and then heat and/or pressure treated to melt the solder to provide electrical connection between the lower and upper HTS filaments. Typical heat, pressure, and time conditions are 200° F. at 250 PSI for <10s.

The striated tapes can be made by laser ablation but its AC loss properties may not be as good as those made by laser lithography. Other double-sided thin adhesive layers (or even photodefinable films such as a photoresist film (Riston)) can also be used but must be amenable to laser machining or photopatterning and can survive temperatures near liquid nitrogen (−196° C.). Solder preforms can be loaded and bonded to the striated tape by another apparatus if it can handle thin (<2 mil) and small (100's μm-1 mm) objects and place them in precise microscopic locations reliably.

This invention provides an efficient and scalable method for aligning and bonding two superimposed high-temperature superconducting (HTS) filamentary tapes to form a single integrated tape structure.

This invention enables the alignment of a bottom and top HTS tape with a thin intervening insulator layer with microscopic precision, and electrically connects the two sets of tape filaments with each other.

The insulating layer also reinforces adhesion of the top and bottom tapes, mitigating mechanical stress at the electrical connections.

The ability of this method to precisely align separate tapes to form a single tape structure makes it compatible with a reel-to-reel production process.

This method of fabricating a striated HTS tape structure allows precision alignment and bonding of filaments between an upper and lower HTS striated tape.

By using indexing holes in the tapes and its components and indexing pins in an alignment jig, the alignment can be maintained before and during the bonding process with high spatial precision and accuracy.

The thin double-sided adhesive minimizes the thickness of the insulating layer and therefore, the contact resistance between the upper and lower filaments.

This invention, in combination with DIBS, enables the precise placement of a consistent volume of solder at the bond locations of each filament thus ensuring reliable electrical connection and eliminating interfilamentary shorting. The double sided adhesive provides mechanical bonding and the solder preforms provide electrical bonding. The features of the current invention (including DIBS) are easily adaptable to a reel-to-reel system and therefore hold high promise for its eventual commercialization.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What we claim is:

1. A high-temperature superconducting striated tape combination of the process comprising the steps of:
    placing a first striated high-temperature superconducting tape with a patterned side facing up and with indexed holes onto an alignment jig using indexing pins as a guide;
    placing a solder release tape with preforms and with indexed holes and wherein the preforms are facing the first striated high-temperature superconducting tape onto the first striated high-temperature superconducting tape on the alignment jig;
    pressing the solder release tape with preforms wherein the preforms are facing the first striated high-temperature superconducting tape onto the first striated high-temperature superconducting tape;
    separating the release tape from the solder preforms;
    allowing the solder preforms to remain bonded to the first striated high-temperature superconducting tape;
    providing a laser-patterned double sided adhesive with windows and with a first liner and a second liner and with indexed holes;
    removing the first liner of the double sided adhesive;
    aligning the laser-patterned double sided adhesive over the indexing pins of the alignment jig with adhesive side facing the first striated high-temperature superconducting tape;
    placing the laser-patterned double sided adhesive onto the first striated high-temperature superconducting tape;
    wherein the windows of the laser-patterned double sided adhesive are aligned with the solder preforms;
    removing the second liner from the laser-patterned double sided adhesive;
    aligning indexing holes of a second striated high-temperature superconducting tape with patterned side facing the first striated high-temperature superconducting tape over the indexing pins of the alignment jig;
    placing the second striated high-temperature superconducting tape onto the laser-patterned double sided adhesive;
    applying pressure and/or heat to the first striated high-temperature superconducting tape and to the laser-patterned double sided adhesive and to the second striated high-temperature superconducting tape; and
    bonding the first striated high-temperature superconducting tape and the laser-patterned double sided adhesive and the second striated high-temperature superconducting tape.

2. The high-temperature superconducting striated tape combination of claim 1
    wherein the alignment jig is a device or structure that aligns and assembles separate components on a 2-D planar or 3-D curved surface with precision.

3. The high-temperature superconducting striated tape combination of claim 2
    wherein the indexed hole matches a complementary index in the alignment jig.

4. The high-temperature superconducting striated tape combination of claim 1
    wherein the tape, double sided adhesive, and solder preforms are aligned and bonded with less than 50 microns spatial tolerance.

5. The high-temperature superconducting striated tape combination of claim 1
    wherein mechanical adhesion between the first striated high-temperature superconducting tape and the second striated high-temperature superconducting tape is provided by the double-sided adhesive.

6. The high-temperature superconducting striated tape combination of claim 1
    wherein electrical isolation or resistance between the first striated high-temperature superconducting tape and the second striated high-temperature superconducting tape is provided by the double-sided adhesive.

7. The high-temperature superconducting striated tape combination of claim 1
    wherein the double-sided adhesive operates from a temperature minimum of −185° C. to a temperature maximum of at least 260° C.

8. The high-temperature superconducting striated tape combination of claim 1
    wherein the step of bonding the first striated high-temperature superconducting tape and the laser-patterned double sided adhesive and the second striated high-temperature superconducting tape occurs when the solder melts.

9. The high-temperature superconducting striated tape combination of claim 1
wherein electrical continuity or conduction between electronic circuitry located on the first striated high-temperature superconducting tape and electronic circuitry located on the second striated high-temperature superconducting tape is provided by solder preforms.

10. The high-temperature superconducting striated tape combination of claim 1
wherein the laser patterned double sided adhesive is laser-cut with a pattern of through-hole windows that matches the pattern of solder preforms.

11. The high-temperature superconducting striated tape combination of claim 1
wherein the method comprises a reel-to-reel system.

12. The high-temperature superconducting striated tape combination of claim 1
wherein the temperature is at about 200° F.

13. The high-temperature superconducting striated tape combination of claim 1
wherein the pressure is at about 250 PSI for <10 seconds.

\* \* \* \* \*